United States Patent
Drost et al.

(10) Patent No.: US 10,345,352 B2
(45) Date of Patent: Jul. 9, 2019

(54) SYSTEM AND METHOD FOR HEALTH MONITORING OF ELECTRICAL SYSTEMS

(71) Applicant: Sikorsky Aircraft Corporation, Stratford, CT (US)

(72) Inventors: Brian Drost, Fairport, NY (US); Howard A. Winston, Woodbury, CT (US); Michael G. Mastrianni, Orange, CT (US); Anthony Santo Maniaci, Rochester, NY (US); Andrew Palladino, Webster, NY (US)

(73) Assignee: SIKORSKY AIRCRAFT CORPORATION, Stratford, CT (US)

( * ) Notice: Subject to any disclaimer, the term of this patent is extended or adjusted under 35 U.S.C. 154(b) by 0 days.

(21) Appl. No.: 15/120,662

(22) PCT Filed: Mar. 26, 2015

(86) PCT No.: PCT/US2015/022730
§ 371 (c)(1),
(2) Date: Aug. 22, 2016

(87) PCT Pub. No.: WO2015/199773
PCT Pub. Date: Dec. 30, 2015

(65) Prior Publication Data
US 2017/0010314 A1    Jan. 12, 2017

Related U.S. Application Data

(60) Provisional application No. 61/974,066, filed on Apr. 2, 2014.

(51) Int. Cl.
*G01R 31/00*        (2006.01)
*G01R 31/11*        (2006.01)

(52) U.S. Cl.
CPC ............ *G01R 31/008* (2013.01); *G01R 31/11* (2013.01)

(58) Field of Classification Search
None
See application file for complete search history.

(56) References Cited

U.S. PATENT DOCUMENTS 6,686,746 B2 * 2/2004 Allan ..................... G01R 31/11
                                                  324/533
6,954,076 B2 * 10/2005 Teich .................. G01R 31/024
                                                  324/533

(Continued)

FOREIGN PATENT DOCUMENTS

GB      2496121 A      5/2013
JP      2010164427 A   7/2010

OTHER PUBLICATIONS

International Search Report and Written Opinion of the International Searching Authority dated Jul. 1, 2016 in related PCT Application No. US2015/022730, 8 pages.

(Continued)

*Primary Examiner* — Douglas X Rodriguez
(74) *Attorney, Agent, or Firm* — Cantor Colburn LLP

(57) ABSTRACT

A method of electrical system fault detection and location determination includes measuring a baseline time domain reflectometry (TDR) waveform along a wire path of the electrical system and obtaining an operating TDR waveform along the wire path. The operating TDR waveform is compared to the baseline TDR waveform to derive a difference TDR waveform, and a difference energy is calculated utilizing the difference TDR waveform. The difference energy is monitored over time for peaks in the difference energy and potential electrical system faults are identified via the peaks in the difference energy.

19 Claims, 5 Drawing Sheets

(56) References Cited

U.S. PATENT DOCUMENTS

| | | | |
|---|---|---|---|
| 7,139,668 B2 | 11/2006 | Bechhoefer | |
| 8,917,097 B2 * | 12/2014 | Landes | G01R 31/008 324/533 |
| 9,210,257 B2 * | 12/2015 | Hall | G01R 31/11 |
| 2003/0206111 A1 * | 11/2003 | Gao | G01R 31/008 340/635 |
| 2005/0270036 A1 | 12/2005 | Allan et al. | |
| 2009/0175195 A1 | 7/2009 | Macauley | |
| 2011/0181295 A1 | 7/2011 | Haugen et al. | |
| 2013/0124119 A1 | 5/2013 | Reynaud et al. | |

OTHER PUBLICATIONS

"Time-domain reflectometry", https://en.wikipedia.org/wiki/Time-domain_reflectometry, 2018, 2 pages.

European Search Report for EP Application No. 15811176.5 dated Nov. 6, 2017; 9 pages.

* cited by examiner

SYSTEM AND METHOD FOR HEALTH MONITORING OF ELECTRICAL SYSTEMS

CROSS-REFERENCE TO RELATED APPLICATIONS

The present application claims priority to U.S. Provisional Application No. 61/974,066 filed on Apr. 2, 2014, and PCT Application No. US2015/022730, filed on Mar. 26, 2015, the contents of which are incorporated by reference herein in their entirety.

FEDERAL RESEARCH STATEMENT

This invention was made with government support with the United States Army under Contract No. W911 W6-10-2-0006. The government therefore has certain rights in this invention.

BACKGROUND

Modern aircraft have large and complex electrical wiring systems, which contain miles of wire and thousands of interconnects. These systems are expensive and time consuming to maintain. Typically, a wire fault affects other systems on the aircraft, which draws the attention of maintainers. They focus on the equipment, which can result in wasted time and the false removal of expensive systems, before they focus on the wiring. With the number of electrical and avionics systems increasing in aircraft, a proportional increase in wiring also occurs. Wires are often routed in hard to reach areas of the aircraft, reducing the ability to conduct a visual inspection for faults or wire condition. The current fleet of deployed aircraft has very little technology to detect and isolate wire faults. Previous technology includes sensors to detect wiring faults, but few have been fully integrated into the aircraft.

BRIEF SUMMARY

In one embodiment, a method of electrical system fault detection and location determination includes measuring a baseline time domain reflectometry (TDR) waveform along a wire path of the electrical system and obtaining an operating TDR waveform along the wire path. The operating TDR waveform is compared to the baseline TDR waveform to derive a difference TDR waveform, and a difference energy is calculated utilizing the difference TDR waveform. The difference energy is monitored over time for peaks in the difference energy and potential electrical system faults are identified via the peaks in the difference energy.

Additionally or alternatively, in this or other embodiments a zero sample location is identified from the baseline TDR waveform indicative of a location of a TDR sensor along the wire path and a location of the potential fault along the wire path is determined with reference to the zero sample location.

Additionally or alternatively, in this or other embodiments the difference TDR waveform is normalized and an exponential moving average TDR waveform is calculated from the normalized difference TDR waveform. The difference energy is calculated utilizing the exponential moving average TDR waveform to reduce false positive fault indications.

Additionally or alternatively, in this or other embodiments data from a plurality of TDR sensors of a plurality of wire paths is input into a reasoner.

Additionally or alternatively, in this or other embodiments data from one or more virtual sensors operably connected to the electrical system repurposed to identify potential electrical system faults is input into the reasoner.

Additionally or alternatively, in this or other embodiments the data is aggregated to identify potential electrical system connector faults.

Additionally or alternatively, in this or other embodiments a health index for each wire path of the plurality of wire paths is output.

Additionally or alternatively, in this or other embodiments the electrical system is an aircraft electrical system and the reasoner is disposed onboard the aircraft.

Additionally or alternatively, in this or other embodiments the data is transmitted to an interactive troubleshooting system to troubleshoot the electrical system utilizing the data.

Additionally or alternatively, in this or other embodiments a first electrical system test is identified based on the transmitted data and the first electrical system test is performed. A first test result is input into the interactive troubleshooting system and the interactive troubleshooting system identifies subsequent electrical system tests to be performed, based on the results of previous electrical system tests until a fault location is identified.

In another embodiment, a health monitoring system for an electrical system includes a plurality of time domain reflectometry (TDR) sensors located at a plurality of wire paths of the electrical system and a TDR signal processor configured to obtain a baseline TDR waveform along a wire path of the electrical system and obtain an operating TDR waveform along the wire path. The operating TDR waveform is compared to the baseline TDR waveform to derive a difference TDR waveform and a difference energy is calculated utilizing the difference TDR waveform. The difference energy is monitored over time for peaks in the difference energy and potential electrical system faults are identified via the peaks in the difference energy.

Additionally or alternatively, in this or other embodiments the TDR signal processor is further configured to identify a zero sample location from the baseline TDR waveform indicative of a location of a TDR sensor along the wire path and determine a location of the potential fault along the wire path with reference to the zero sample location.

Additionally or alternatively, in this or other embodiments the TDR signal processor is configured to normalize the difference TDR waveform, calculate an exponential moving average TDR waveform from the normalized difference TDR waveform and calculate the difference energy utilizing the exponential moving average TDR waveform to reduce false positive fault indications.

Additionally or alternatively, in this or other embodiments a reasoner receives data input from the TDR signal processor.

Additionally or alternatively, in this or other embodiments the reasoner is configured to aggregate the data to identify potential electrical system connector faults.

Additionally or alternatively, in this or other embodiments the reasoner is configured to output a health index for each wire path of the plurality of wire paths.

Additionally or alternatively, in this or other embodiments the electrical system is an aircraft electrical system and the reasoner is disposed onboard the aircraft.

Additionally or alternatively, in this or other embodiments an interactive troubleshooting system is utilized to troubleshoot the electrical system utilizing the data.

Additionally or alternatively, in this or other embodiments the interactive troubleshooting system is configured to identify a first electrical system test based on the transmitted data, evaluate a first test result input into the interactive troubleshooting system, and identify subsequent electrical system tests to be performed, based on the results of previous electrical system tests until a fault location is identified.

These and other advantages and features will become more apparent from the following description taken in conjunction with the drawings.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Figure 1:
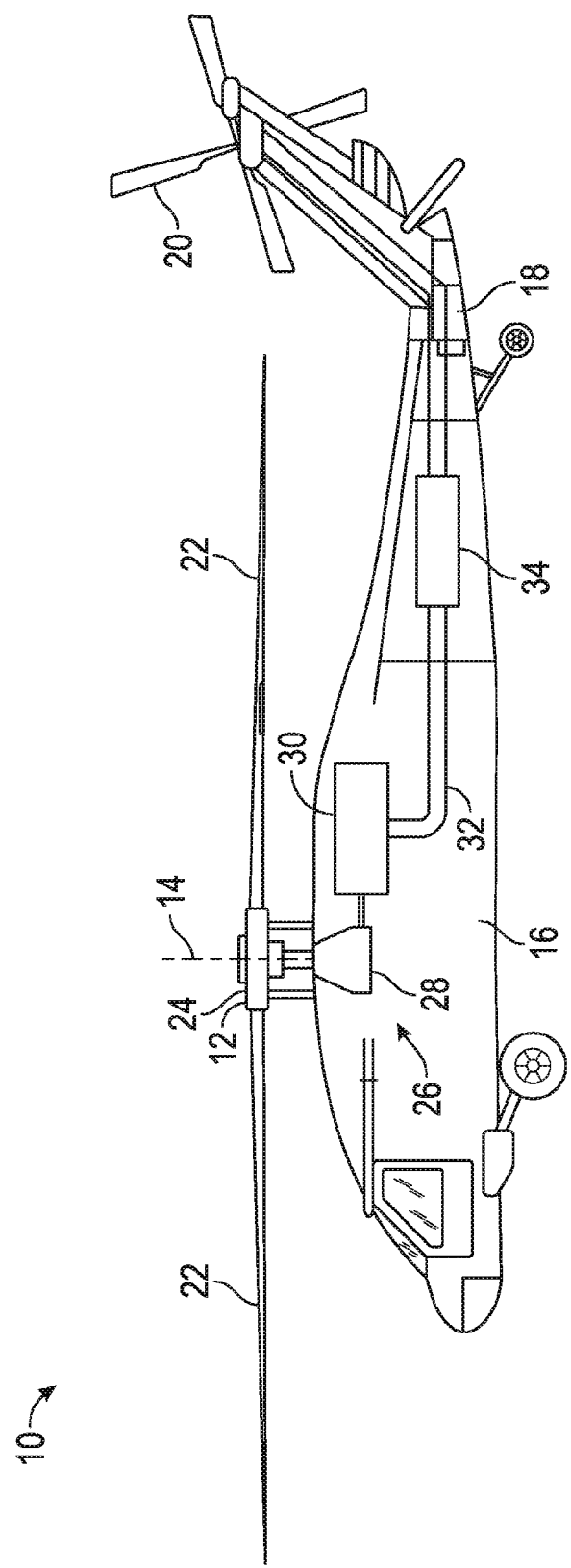
FIG. 1 is a general side view of an exemplary rotary wing aircraft for use in accordance with embodiments.

FIG. 1 illustrates an exemplary rotary-winged aircraft 10 having a main rotor system 12, which rotates about a rotor axis 14. The aircraft 10 includes an airframe 16 which supports the main rotor system 12 as well as an extending tail 18 including a tail rotor 20. The main rotor system 12 includes a plurality of rotor blade assemblies 22 mounted to a rotor hub assembly 24. The main rotor system 12 is driven by a transmission 26. The transmission 26 includes a main gearbox 28 driven by one or more engines, illustrated schematically at 30. The main gearbox 28 and engines 30 are considered as part of the non-rotating frame of the aircraft 10. In the case of a rotary wing aircraft, the main gearbox 28 may be interposed between one or more gas turbine engines 30 and the main rotor system 12. The aircraft further includes a tail rotor shaft 32 and tail rotor gearbox 34 connected to the transmission 26 to drive rotation of the tail rotor 20. The aircraft 10 further includes an electrical system including wires, connectors, and other such components, to provide electrical power to various components of the aircraft 10. Although a particular rotary wing aircraft configuration is illustrated and described in the disclosed non-limiting embodiment, other configurations and/or machines with rotor systems are within the scope of the present invention. Further, one skilled in the art will readily appreciate that the present disclosure may be utilized in other, non-rotary winged aircraft applications. It is to be appreciated that while the description herein relates to a rotary wing aircraft, the disclosure herein may be as readily applied to other aircraft or structures, or to any article having a complex electrical system.

Figure 2:
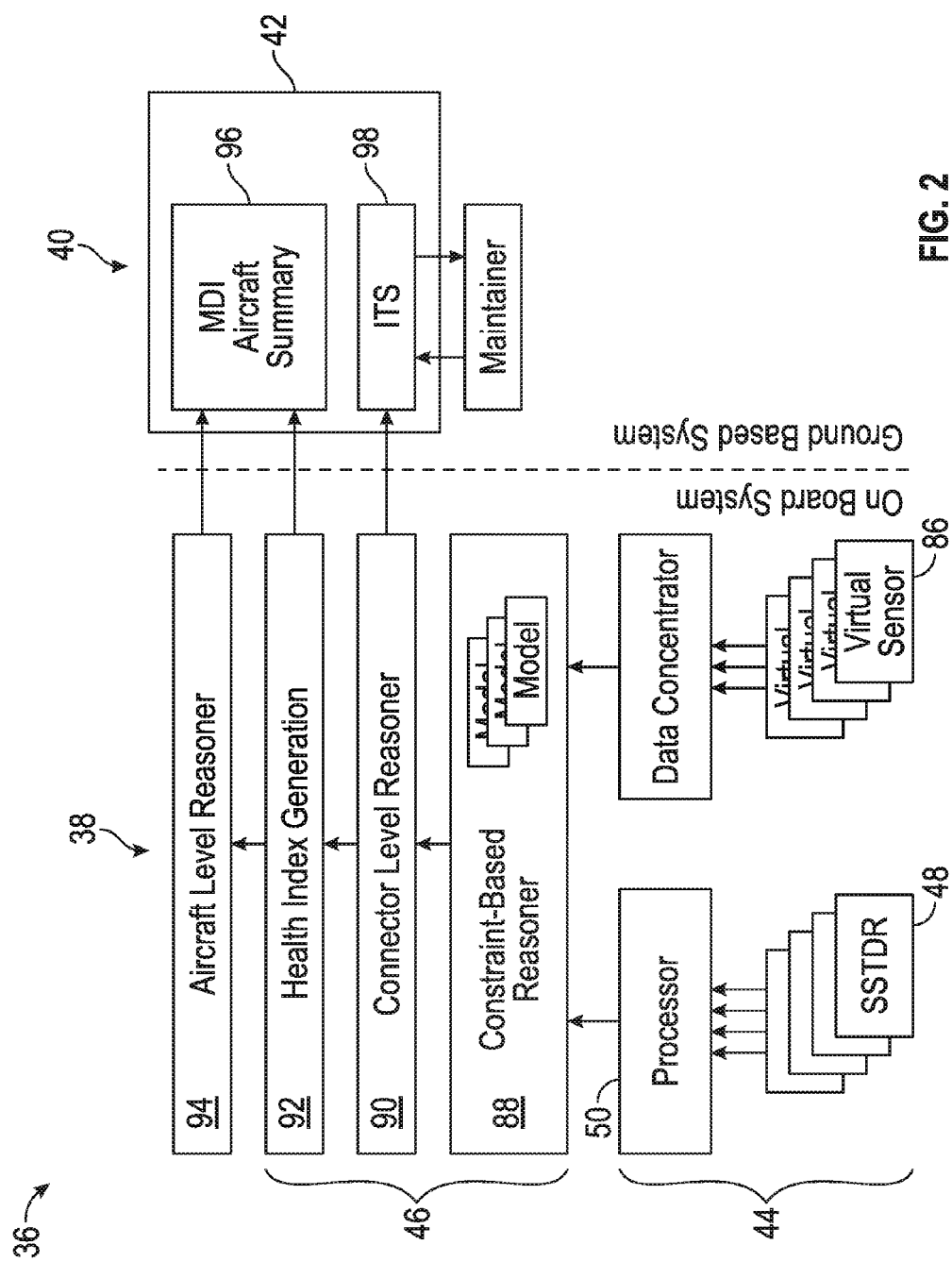
FIG. 2 is a schematic illustration of an exemplary wire fault detection and isolation system.

Referring now to FIG. 2, to detect potential faults in the aircraft 10 electrical system and to take steps to isolate those faults to particular portions of the electrical system, a wire fault detection and isolation system 36 is provided. The system 36 includes an onboard portion 38 residing on the aircraft 10, and a ground-based portion 40 residing on, for example, a computing device 42 such as a laptop computer, hand-held computing device, smart phone or the like.

The onboard portion 38 includes a sensing portion 44 and an on-board reasoning portion 46. The sensing portion 44 includes a plurality of time domain reflectometers (TDRs) 48 as sensing mechanisms. The TDR's 48 may be, for example, spread spectrum TDRs, also known as SSTDRs, or optical TDRs, also referred to as OTDRs. The TDRs 48 transmit signals along specific wires of the electrical system. The signal is reflected back to the TDRs 48 and is indicative of the condition or health of the wire and/or connectors along the wire. The output of each TDR 48 is a waveform over time, and finding features in the wave form indicative of a fault can be difficult, particularly in high-noise environments.

Figure 3:
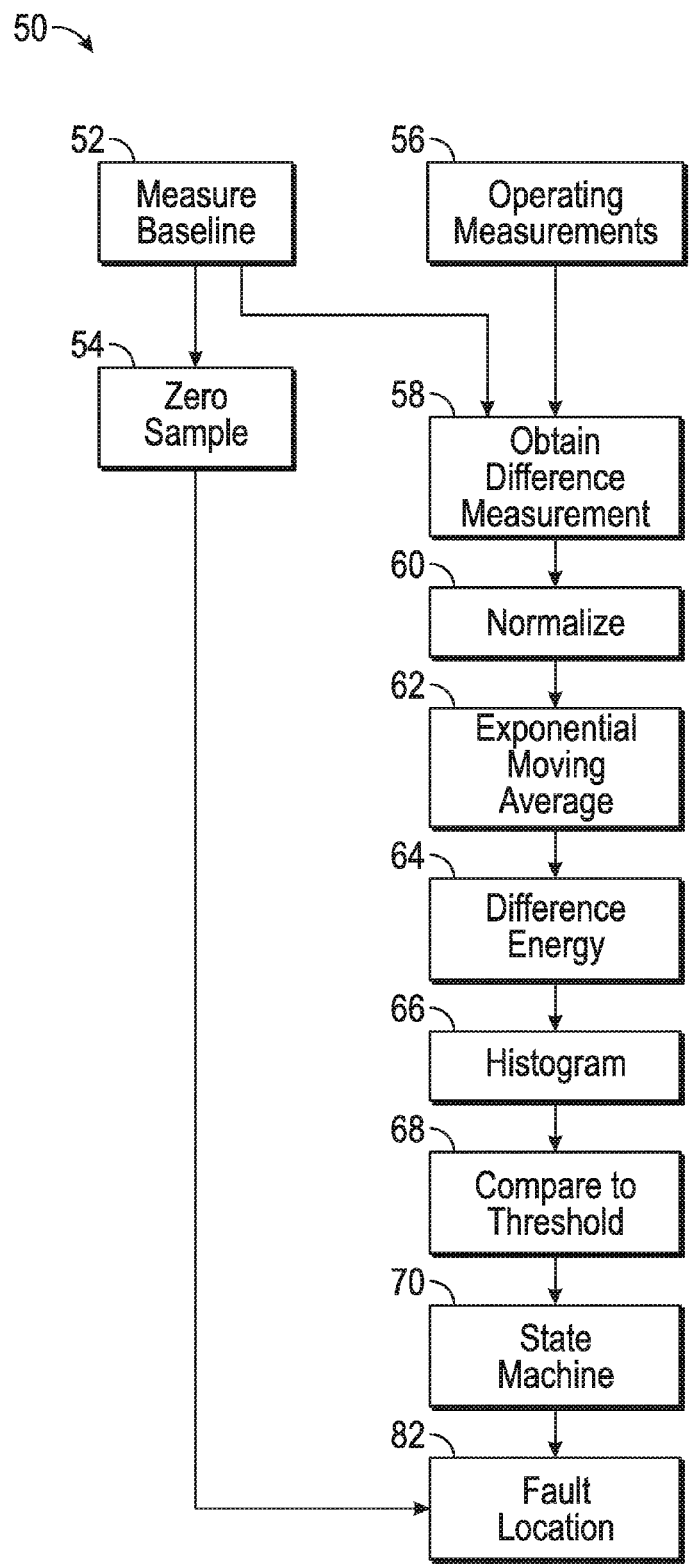
FIG. 3 is a schematic view of a signal processing algorithm for wire fault detection.
Figure 4:
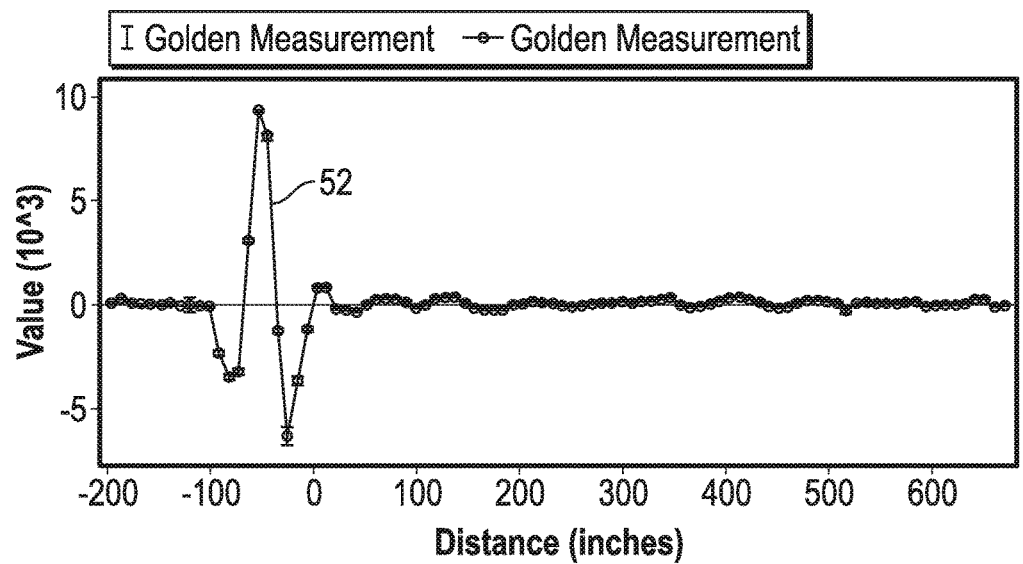
FIG. 4 is an illustration of an exemplary measured waveform.
Figure 5:
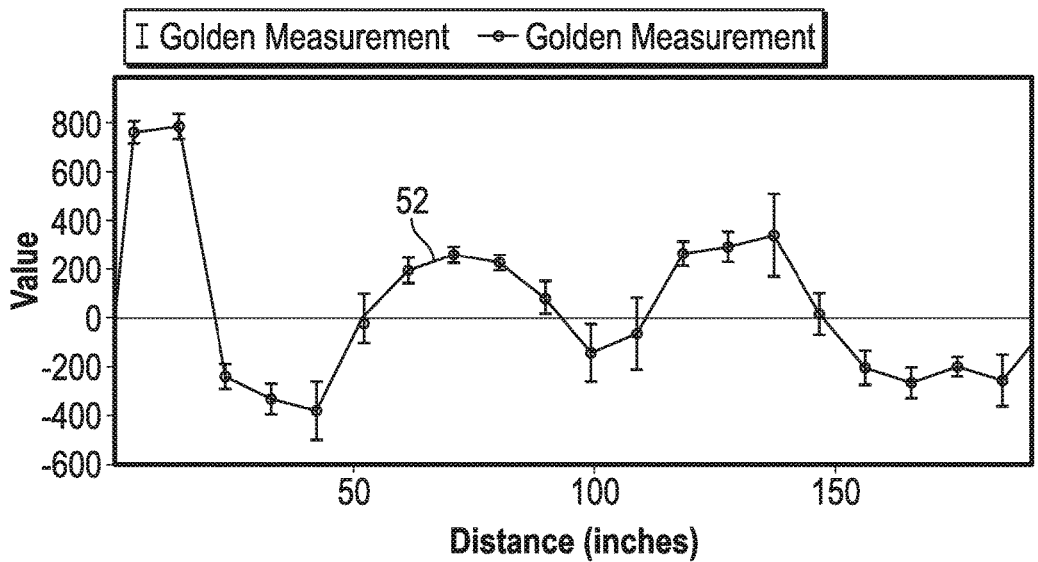
FIG. 5 is an illustration of another exemplary waveform.

To improve performance of the TDRs 48, a processing algorithm 50 was developed to identify faults in the electrical system. The processing algorithm 50, shown schematically in FIG. 3, includes establishing a baseline measurement 52 for each TDR 48. The baseline measurement 52 is taken when the TDR 48 is connected to a wire known to be healthy. The baseline measurement 52 can then be stored for later use by the processing algorithm 50. The waveform of the baseline measurement 52 includes a plurality of samples, with a mean and variance calculated for each sample location. An example baseline measurement 52 is illustrated in FIGS. 4 and 5. Referring again to FIG. 3, a zero sample 54, identified as a location where the TDR 48 meets the wire being measured, is derived from the baseline measurement 52. The zero sample 54 serves as a reference for determining the location of faults along the length of the wire. During operation, operating measurements 56 are taken by the TDR 48. These operating measurements 56 are compared to their respective baseline measurements 52 to arrive at difference measurements 58 by, for example, subtracting the baseline measurements 52 from the operating measurements 56. The difference measurement 58 is normalized utilizing a standard deviation calculated as part of the baseline measurement 52. The normalized difference 60 is then used to derive an exponential moving average 62. This exponential moving average 62 filters out transient results that may lead to false positive fault indications. A difference energy 64 is then calculated utilizing the exponential moving average 62, which is used to determine whether a fault is present. When a fault is present the difference measurement 58 has larger values and thus a higher level of difference energy 64. To further eliminate false positives, the difference energy 64 calculations are collected over specified time windows, with the results collected in energy bins 66 as shown in the graph, for example, histogram, of FIG. 6, and analyzed compared to a difference energy threshold 68. This analysis allows the processing algorithm 50 to ignore transient spikes in the energy.

Figure 6:
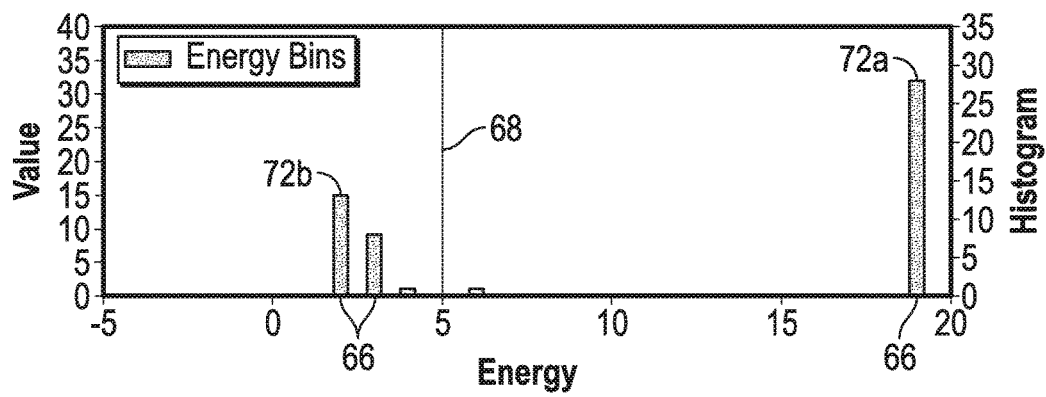
FIG. 6 is an exemplary histogram analysis of measured difference energy.
Figure 7:
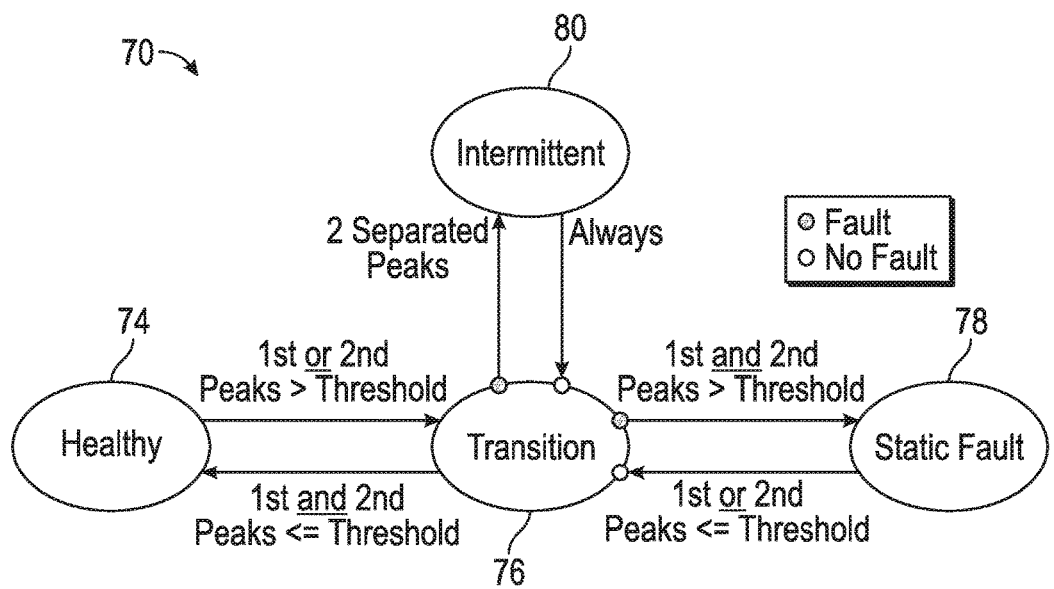
FIG. 7 is a schematic view of an exemplary state machine.

The distribution of difference energy 64 is then input into a state machine 70 for analysis. The state machine 70 calculates two peak energy values 72 from the distribution. Referring to FIG. 6 if a first peak energy value 72a and a second peak energy value 72b are below the difference energy threshold 68, the state machine 70 remains in a healthy state 74, indicating that no fault is present. If either of the peak energy values 72a, 72b exceeds the difference energy threshold 68, the state machine 70 moves to a transition state 76. If both peak energy values 72a, 72b exceed the difference energy threshold 68, the state machine 70 will then indicate a static fault 78, while if the peak energy values 72a, 72b are separate and distinct with, for example the first peak energy value 72a above the difference energy threshold 68 and the second peak energy value 72b below the difference energy threshold 68, the state machine 70 moves to indicate an intermittent fault 80.

Referring again to FIG. 3, once either a static fault 78 or intermittent fault 80 is indicated, a fault location estimate 82 is determined by analyzing the difference measurement 58 for a peak difference. This peak is then identified as a peak location, indicative of the fault location, with a distance from the TDR 48 utilizing the zero sample 54.

Referring again to FIG. 2, the on-board reasoning portion 46 utilizes output from the processing algorithm 50, as well as input from on-board virtual sensors 86 to analyze potential fault conditions. The virtual sensors 86 re-purpose existing aircraft 10 data to be used in the determination of wire health. Virtual sensors 86 include sensors previously included in the aircraft 10 for other purposes, such as chip detectors. A chip detector detects chips of metal in the transmission 26. Chip detectors, however, utilize a built-in test (BIT) at startup, which can be used to infer that the wiring to the chip detector is healthy. The chip detector is merely exemplary of an existing sensor utilized to aid in determining wire health, and one skilled in the art will readily appreciate that other similar sensors may be similarly repurposed. The on-board reasoning portion 46 includes a constraint-based reasoner 88, which processes information for each wire path independently. The output from the constraint-based reasoner 88 is input into a connector level reasoner 90, which aggregates the results and looks for convergence of fault information at specific electrical connectors of the electrical system. Convergence of fault information at a specific connector may indicate a fault with the connector itself. Further, the on-board reasoning portion 46 includes a health index generator 92, which computes a health index for each wire path and connector in the system, and provides the computed health indices to an aircraft level reasoner 94.

The ground-based portion 40 includes a maintenance data interface (MDI) 96, which provides a summary of information from the on-board reasoning portion 46, such as health indices. This can be used to organize the maintenance activities, focusing on systems with major issues first. Additionally, this provides an opportunity to analyze the health indices and condition indicators for statistically significant changes. Further, the ground-based portion 40 includes an interactive troubleshooting system (ITS) 98. The ITS 98 utilizes information downloaded from the on-board reasoning portion 46, and formulates tests for a maintainer to perform on the electrical system. The tests are pass/fail tests, and may utilize tools such as an ohm-meter. The maintainer performs the tests as prompted by the ITS 98 and inputs the results, either manually or via an automatic link, into the ITS 98. The ITS 98 uses the results to determine follow-on tests for the maintainer to perform. The tests are performed until a fault location can be isolated.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A method of electrical system fault detection and location determination in an electrical system comprising:
   connecting one or more time domain reflectometers (TDR's) to a wire known to be healthy;
   measuring, in an onboard portion of a wire fault detection system, a baseline time domain reflectometry (TDR) waveform of the wire known to be healthy;
   connecting one or more TDR's to a wire path in the on-board portion;
   transmitting signals along the wire path;
   obtaining, in the on-board portion, an operating TDR waveform along the wire path from the transmitted signals;
   comparing, in the on-board portion, the operating TDR waveform to the baseline TDR waveform to derive a difference TDR waveform;
   calculating, in the on-board portion, a difference energy of the difference TDR waveform utilizing an exponential moving average;
   monitoring, in the on-board portion, the difference energy over time for peaks in the difference energy;
   improving performance of a time domain reflectometer (TDR) by identifying, in the on-board portion, potential electrical system faults via the peaks in the difference energy; and
   communicating a summary of the potential electrical system faults to a ground-based portion of the wire fault detection system for a maintainer.

2. The method of claim 1, further comprising:
   identifying a zero sample location from the baseline TDR waveform indicative of a location of a TDR sensor along the wire path; and
   determining a location of the potential electrical system fault along the wire path with reference to the zero sample location.

3. The method of claim 1, further comprising:
   normalizing the difference TDR waveform;
   calculating the exponential moving average TDR waveform from the normalized difference TDR waveform; and
   calculating the difference energy utilizing the exponential moving average TDR waveform to reduce false positive fault indications.

4. The method of claim 1, further comprising inputting data from a plurality of TDR sensors of a plurality of wire paths into a reasoner.

5. The method of claim 4, further comprising inputting data from one or more virtual sensors operably connected to the electrical system repurposed to identify the potential electrical system faults into the reasoner.

6. The method of claim 4, further comprising aggregating the data to identify potential electrical system connector faults.

7. The method of claim 4, further comprising outputting a health index for each wire path of the plurality of wire paths.

8. The method of claim 4, wherein the electrical system is an aircraft electrical system and the reasoner is disposed onboard the aircraft.

9. The method of claim 4, further comprising transmitting the data to an interactive troubleshooting system to troubleshoot the electrical system utilizing the data.

10. The method of claim 9, wherein:

a first electrical system test is identified based on the transmitted data;

the first electrical system test is performed;

a first test result is input into the interactive troubleshooting system; and the interactive troubleshooting system identifies subsequent electrical system tests to be performed, based on the results of previous electrical system tests until a fault location is identified.

11. A health monitoring system for an electrical system comprising:

a plurality of time domain reflectometry (TDR) sensors disposed at a plurality of wire paths of the electrical system; and a TDR signal processor configured to:

connect one or more time domain reflectometers (TDR's) to a wire known to be healthy;

obtain, in an onboard portion of a wire fault detection system, a baseline TDR waveform along a wire path of the electrical system of the wire known to be healthy;

connect one or more TDR's to a wire path in the on-board portion;

transmit signals along the wire path;

obtain, in the on-board portion, an operating TDR waveform along the wire path from the transmitted signals;

compare the operating TDR waveform to the baseline TDR waveform to derive a difference TDR waveform;

calculate, in the on-board portion, a difference energy of the difference TDR waveform utilizing an exponential moving average;

monitor, in the on-board portion, the difference energy over time for peaks in the difference energy;

improve performance of a time domain reflectometer (TDR) by identifying, in the on-board portion, potential electrical system faults via the peaks in the difference energy; and communicate a summary of the potential electrical system faults to a ground-based portion of the wire fault detection system for a maintainer.

12. The system of claim 11, wherein the TDR signal processor is further configured to:

identify a zero sample location from the baseline TDR waveform indicative of a location of a TDR sensor along the wire path; and determine a location of the potential electrical system fault along the wire path with reference to the zero sample location.

13. The system of claim 11, wherein the TDR signal processor is configured to:

normalize the difference TDR waveform;

calculate the exponential moving average TDR waveform from the normalized difference TDR waveform; and calculate the difference energy utilizing the exponential moving average TDR waveform to reduce false positive fault indications.

14. The system of claim 11, further comprising a reasoner to receive data input from the TDR signal processor.

15. The system of claim 14, wherein the reasoner is configured to aggregate the data to identify potential electrical system connector faults.

16. The system of claim 14, wherein the reasoner is configured to output a health index for each wire path of the plurality of wire paths.

17. The system of claim 14, wherein the electrical system is an aircraft electrical system and the reasoner is disposed onboard the aircraft.

18. The system of claim 14, further comprising an interactive troubleshooting system to troubleshoot the electrical system utilizing the data.

19. The system of claim 18, wherein the interactive troubleshooting system is configured to:

identify a first electrical system test based on the transmitted data;

evaluate a first test result input into the interactive troubleshooting system; and identify subsequent electrical system tests to be performed, based on the results of previous electrical system tests until a fault location is identified.

* * * * *